US012573811B2

(12) United States Patent
Tian et al.

(10) Patent No.: US 12,573,811 B2
(45) Date of Patent: Mar. 10, 2026

(54) LASER DEVICE AND LASER PROJECTION APPARATUS

(71) Applicant: Hisense Laser Display Co., Ltd, Qingdao City (CN)

(72) Inventors: Youliang Tian, Qingdao City (CN); Zinan Zhou, Qingdao City (CN); Xin Zhang, Qingdao City (CN); Yunchen Lu, Qingdao City (CN)

(73) Assignee: Hisense Laser Display Co., Ltd, Qingdao City (CN)

( * ) Notice: Subject to any disclaimer, the term of this patent is extended or adjusted under 35 U.S.C. 154(b) by 723 days.

(21) Appl. No.: 17/936,584

(22) Filed: Sep. 29, 2022

(65) Prior Publication Data

US 2023/0025704 A1 Jan. 26, 2023

Related U.S. Application Data

(63) Continuation of application No. PCT/CN2021/082163, filed on Mar. 22, 2021.

(30) Foreign Application Priority Data

Apr. 21, 2020 (CN) .......................... 202010318102.3

(51) Int. Cl.
*H01S 5/024* (2006.01)
*G03B 21/20* (2006.01)
(Continued)

(52) U.S. Cl.
CPC ........ *H01S 5/02469* (2013.01); *H01S 5/0071* (2013.01); *H01S 5/0222* (2013.01);
(Continued)

(58) Field of Classification Search
CPC .. H01S 5/0237; H01S 5/04254; H01S 5/0234; H01S 5/22; H01S 5/02315;
(Continued)

(56) References Cited

U.S. PATENT DOCUMENTS 5,812,570 A * 9/1998 Spaeth .................... H01S 5/024
372/36
2005/0051785 A1* 3/2005 Erchak ................ G02B 6/1225
257/E33.068
(Continued)

FOREIGN PATENT DOCUMENTS

CN 202352675 U 7/2012
CN 102694341 A 9/2012
(Continued)

OTHER PUBLICATIONS

Hiroyuki_English, hiroyuki translation (Year: 2003).*
(Continued)

*Primary Examiner* — Minsun O Harvey
*Assistant Examiner* — Alexander Ehrlich
(74) *Attorney, Agent, or Firm* — Schwegman Lundberg & Woessner, P.A.

(57) ABSTRACT

A laser device is provided. The laser device includes a bottom plate, a frame body, a heat sink and a light-emitting chip. The light-emitting chip is located on a surface of the heat sink away from the bottom plate. The light-emitting chip includes a plurality of first protrusions and/or a plurality of first depressions, the plurality of first protrusions and/or the plurality of first depressions are located on a first surface of the light-emitting chip; the heat sink includes a plurality of second depressions and/or a plurality of second protrusions, the plurality of second depressions and/or the plurality of second protrusions are located on a second surface of the heat sink; the plurality of first protrusions are located in the plurality of second depressions, and the plurality of second protrusions are located in the plurality of first depressions.

20 Claims, 8 Drawing Sheets

(51) Int. Cl.

| | |
|---|---|
| *H01S 5/00* | (2006.01) |
| *H01S 5/0222* | (2021.01) |
| *H01S 5/0237* | (2021.01) |
| *H01S 5/042* | (2006.01) |

(52) U.S. Cl.
CPC ........ *H01S 5/0237* (2021.01); *H01S 5/04254* (2019.08); *G03B 21/2033* (2013.01)

(58) Field of Classification Search
CPC ............ H01S 5/02461; H01S 5/02476; H01S 5/02255; H01S 5/02216; H01S 5/02253; H01S 5/02335; H01S 5/0207; H01S 5/405; H01S 2301/176; G03B 21/2033; G03B 21/16; H10H 20/82; H10H 20/8583
See application file for complete search history.

(56) References Cited

U.S. PATENT DOCUMENTS

| | | | | |
|---|---|---|---|---|
| 2009/0092162 | A1* | 4/2009 | Huff ........................ | H01S 5/024 372/50.12 |
| 2012/0099185 | A1* | 4/2012 | Yokoyama ............ | H01S 5/0657 372/18 |
| 2018/0145478 | A1* | 5/2018 | Sakai .................. | H01S 5/02469 |
| 2018/0331505 | A1* | 11/2018 | Ochiai .................. | H01S 5/2086 |
| 2019/0097388 | A1* | 3/2019 | Matsuo .............. | H01S 5/02234 |

FOREIGN PATENT DOCUMENTS

| | | | | | |
|---|---|---|---|---|---|
| CN | 202513207 | U | | 10/2012 | |
| CN | 103208470 | A | | 7/2013 | |
| CN | 103427330 | A | | 12/2013 | |
| CN | 104078837 | A | | 10/2014 | |
| CN | 206312938 | U | | 7/2017 | |
| CN | 208835449 | U | | 5/2019 | |
| JP | H06103780 | B2 | * | 12/1994 | ........ H01S 5/02325 |
| JP | 2003086883 | A | | 3/2003 | |
| JP | 2003179295 | A | * | 6/2003 | |
| JP | 2005142224 | A | | 6/2005 | |
| TW | 201034206 | A | | 9/2010 | |
| WO | WO-2021213107 | A1 | | 10/2021 | |

OTHER PUBLICATIONS

Tanaka_English, tanaka/田中 治夫 translation (Year: 1994).*
"Chinese Application Serial No. 202010318102.3, Office Action mailed Mar. 18, 2022", with English translation, 15 pgs.
"Chinese Application Serial No. 202010318102.3, Office Action mailed Oct. 21, 2022", with English translation, 10 pgs.
"Chinese Application Serial No. 202180029641.8, Office Action mailed Jan. 29, 2024", with English translation, 14 pgs.
"International Application No. PCT/CN2021/082163, International Search Report and Written Opinion dated Jun. 8, 2021", (Jun. 8, 2021), 9 pgs.

* cited by examiner

LASER DEVICE AND LASER PROJECTION APPARATUS

CROSS-REFERENCE TO RELATED APPLICATIONS

This application is a continuation application of International Patent Application No. PCT/CN2021/082163, filed on Mar. 22, 2021, which claims priority to Chinese Patent Application No. 202010318102.3, filed on Apr. 21, 2020, which are incorporated herein by reference in their entirety.

TECHNICAL FIELD

The present disclosure relates to the field of laser display, and in particular, to a laser device and a laser projection apparatus.

BACKGROUND

Laser devices are widely used with the development of laser display technologies. Laser devices are being used in more and more fields due to the purity and spectral stability of the light emitted thereby. For example, a laser device may be used in a laser projection apparatus, which is a projection display apparatus that adopts a laser source as a display light source and cooperates with projection display technologies to form an image.

SUMMARY

Some embodiments of the present disclosure provide a laser device. The laser device includes a bottom plate, a frame body, a heat sink and a light-emitting chip. The frame body is disposed on the bottom plate, the frame body and the bottom plate form an accommodating space. The heat sink is located on the bottom plate and in the accommodating space. The light-emitting chip is located on a surface of the heat sink away from the bottom plate and is located in the accommodating space. The light-emitting chip includes a plurality of first protrusions and/or a plurality of first depressions, the plurality of first protrusions and/or the plurality of first depressions are located on a first surface of the light-emitting chip, the first surface is fixed to the heat sink. The heat sink includes a plurality of second depressions and/or a plurality of second protrusions, the plurality of second protrusions and/or the plurality of second depressions are located on a second surface of the heat sink, the second surface is fixed to the light-emitting chip; the first surface of the light-emitting chip is in contact with the second surface of the heat sink, the plurality of first protrusions are located in the plurality of second depressions, the plurality of second protrusions are located in the plurality of first depressions.

Some embodiments of the present disclosure provide a laser projection apparatus. The laser projection apparatus includes a laser source, an optical engine and a projection lens. The laser source includes the laser device as described above, and the laser source is configured to emit illumination beams. The optical engine is configured to modulate the illumination beams emitted by the laser source to obtain projection beams. The projection lens is configured to project the projection beams to into an image.

BRIEF DESCRIPTION OF THE DRAWINGS

In order to describe the technical solutions of the embodiments of the present invention more clearly, accompanying drawings to be used in the description of some embodiments will be introduced briefly below. Obviously, the accompanying drawings to be described below are merely accompanying drawings of some embodiments of the present application, and a person having ordinary skill in the art may obtain other drawings according to these drawings without creative effort. In addition, the accompanying drawings in the following description may be regarded as schematic diagrams, and are not limitations on actual sizes of products, actual processes of methods and actual timings of signals to which the embodiments of the present disclosure relate.

DETAILED DESCRIPTION

Figure 1:
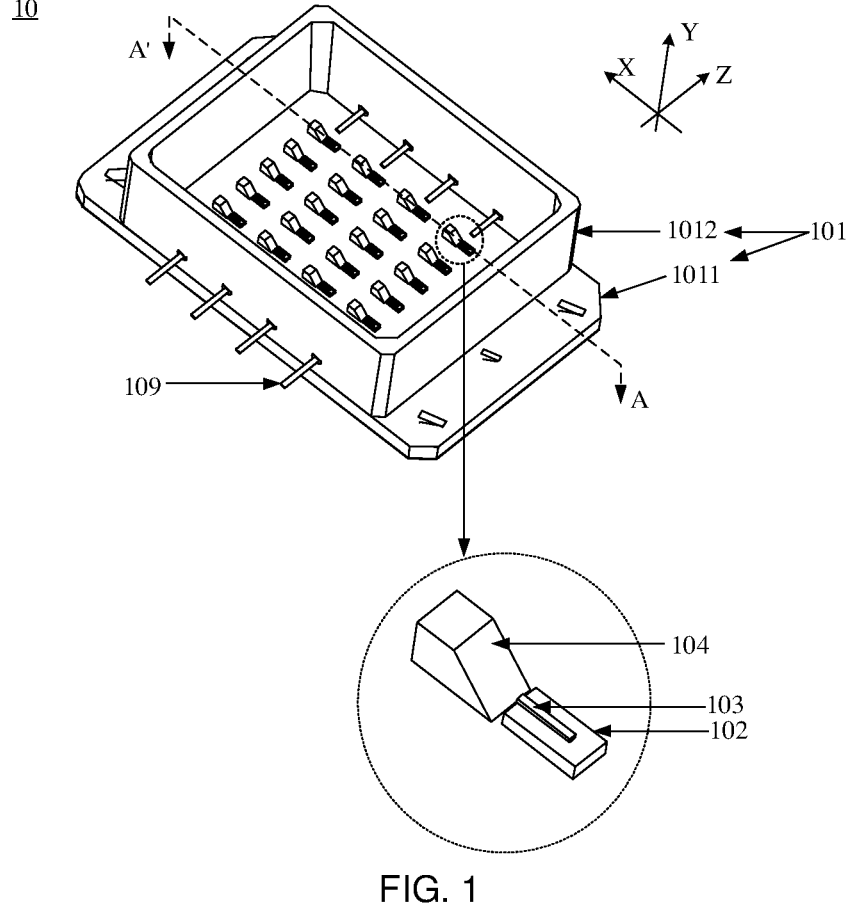
FIG. 1 is a structural diagram of a laser device, in accordance with some embodiments.

The technical solutions in the embodiments of the present application will be clearly and completely described below with reference to the accompanying drawings. Obviously, the described embodiments are merely some but not all embodiments of the present application. All other embodiments obtained by a person having ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive sense, i.e., "including, but not limited to". In the description of the specification, the terms such as "one embodiment", "some embodiments", "exemplary embodiments", "example", "specific example"

or "some examples" are intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, specific features, structures, materials, or characteristics described herein may be included in any one or more embodiments or examples in any suitable manner.

The terms "first" and "second" are used for descriptive purposes only, and are not to be construed as indicating or implying a relative importance or implicitly indicating a number of indicated technical features. Therefore, the features defined with the terms "first" and "second" may explicitly or implicitly include one or more of these features. In the description of the embodiments of the present disclosure, the terms "a plurality of", "the plurality of" and "multiple" each mean two or more unless otherwise specified.

In the description of some embodiments, the expressions "coupled" and "connected" and derivatives thereof may be used. The term "connected" should be understood in a broad sense; for example, "connected" may represent a fixed connection, a detachable connection, or connected as an integral body; "connected" may be directly "connected" or indirectly "connected" through an intermediate means. The term "coupled" may be used in the description of some embodiments to indicate that two or more components are in direct physical or electrical contact with each other. The term "coupled" or "communicatively coupled", however, may also mean that two or more components are not in direct contact with each other, but still cooperate or interact with each other. The embodiments disclosed herein are not necessarily limited to the content herein.

The phrase "A and/or B" includes the following three combinations: only A, only B, and a combination of A and B.

The phrase "at least one of A, B and C" has the same meaning as the phrase "at least one of A, B or C", they both include following combinations of A, B and C: only A, only B, only C, a combination of A and B, a combination of A and C, a combination of B and C, and a combination of A, B and C.

The terms such as "about," "substantially," or "approximately" as used herein include a stated value and an average value within an acceptable range of deviation of a particular value determined by a person of ordinary skill in the art, where the acceptable deviation range is determined by a person of ordinary skill in the art in consideration of the measurement in question and the error associated with the measurement of a specific quantity (i.e., the limitation of the measurement system).

The terms "parallel", "perpendicular" and "equal" as used herein include the stated conditions and the conditions similar to the stated conditions, and the range of the similar conditions is within the acceptable deviation range, where the acceptable deviation range is determined by a person of ordinary skill in the art in consideration of the measurement in question and the error associated with the measurement of a specific quantity (i.e., the limitation of the measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals of less than or equal to 5% of either of the two equals.

Exemplary embodiments are described herein with reference to sectional views and/or plan views that are schematic illustrations of idealized embodiments. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. Thus, the regions shown in the accompanying drawings are schematic in nature, and their shapes are not intended to show actual shapes of regions in a device, and are not intended to limit the scope of the exemplary embodiments.

Figure 11:
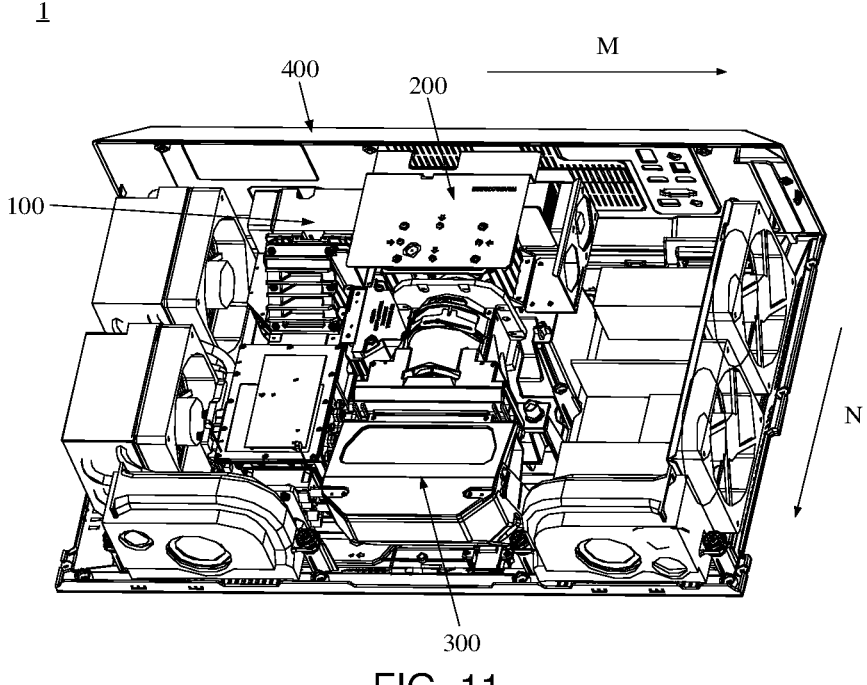
FIG. 11 is a structural diagram of a laser projection apparatus, in accordance with some embodiments.

Some embodiments of the present disclosure provide a laser projection apparatus 1. As shown in FIG. 11, the laser projection apparatus 1 includes a housing 400 (only part of the housing is shown in FIG. 11), and a laser source 100, an optical engine 200 and a projection lens 300 that are assembled in the housing 400. The laser source 100 is configured to provide illumination beams (laser beams). The optical engine 200 is configured to modulate the illumination beams provided by the laser source 100 with image signals to obtain projection beams. The projection lens 300 is configured to project the projection beams into an image on a projection screen.

The laser source 100, the optical engine 200 and the projection lens 300 are connected in sequence in a propagation direction of laser beams, and are each wrapped by a corresponding shell. The laser source 100, the optical engine 200 and the projection lens 300 are supported by the corresponding shell, so as to enable these optical components to meet certain sealing or airtight requirements.

In some embodiments, an end of the optical engine 200 is connected to the laser source 100, and another end thereof is connected to the projection lens 300. The laser source 100 and the optical engine 200 are arranged in an exit direction (referring to the direction M shown in FIG. 11) of the illumination beams of the laser projection apparatus 1, and the optical engine 200 and the projection lens 300 are arranged in an exit direction (referring to the direction N as shown in FIG. 11) of the projection beams of the laser projection apparatus 1, the direction M is substantially perpendicular to the direction N. On one hand, such a connection structure may adapt to characteristics of an optical path of a reflective light valve in the optical engine 200; on another hand, it is also beneficial to shorten a length of an optical path in a one-dimension direction, which is in turn conducive to a structural arrangement of a projection host. For example, in a case where the laser source 100, the optical engine 200 and the projection lens 300 are arranged in a one-dimension direction (e.g., the direction M), a length of an optical path in the direction is relatively long, which is not conducive to the structural arrangement of the projection host.

Figure 12:
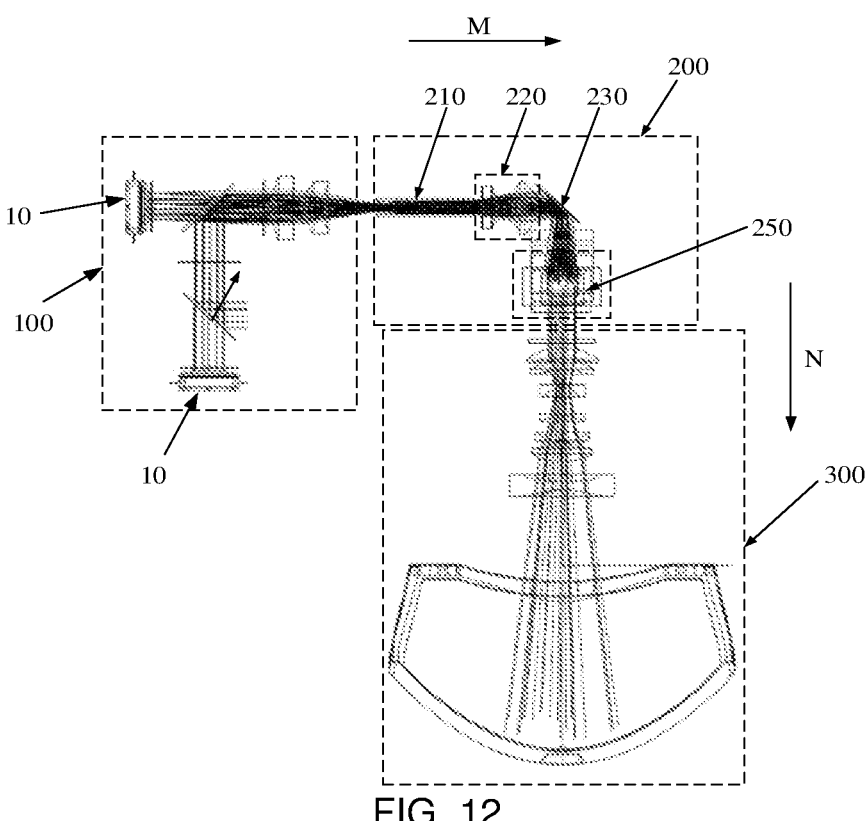
FIG. 12 is a diagram showing an optical path of a laser source, an optical engine and a projection lens in a laser projection apparatus, in accordance with some embodiments.

In some embodiments, the laser source 100 can provide laser beams of three primary colors sequentially (laser beams of other color may also be added on the basis of the laser beams of three primary colors). Due to persistence of vision of human eyes, the laser beams observed by the human eyes are white laser beams formed by a mixture of the laser beams of three primary colors. The laser source 100 can also simultaneously output the laser beams of three primary colors, and continuously emit the white laser beams. The laser source 100 includes a laser device 10 (as shown in FIG. 12). The laser device 10 can emit laser beams of a single color or various colors, such as a red laser beam, a blue laser beam or a green laser beam.

Figure 13:
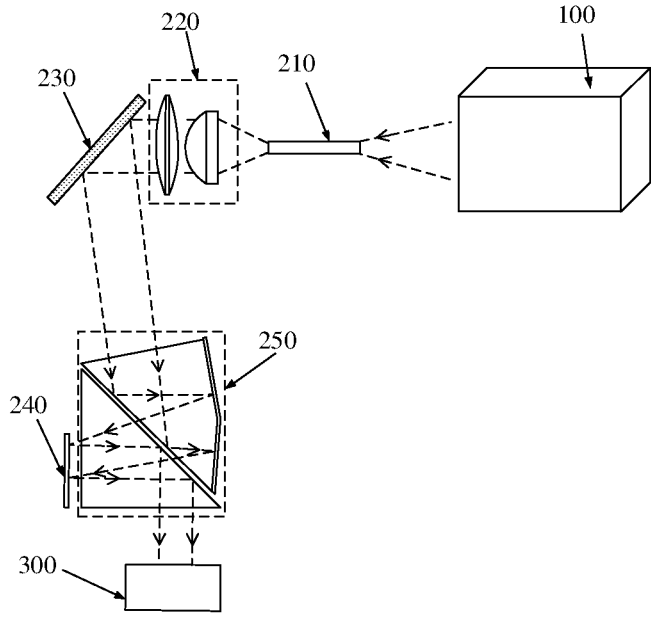
FIG. 13 is a diagram showing another optical path of a laser source, an optical engine and a projection lens in a laser projection apparatus, in accordance with some embodiments.

The illumination beams emitted by the laser source 100 enter the optical engine 200. In some embodiments, as shown in FIGS. 12 and 13, the optical engine 200 includes a light pipe 210, a lens assembly 220, a reflector 230, a digital micromirror device (DMD) 240 and a prism assembly 250. The light pipe 210 may receive the illumination beams provided by the laser source 100 and homogenize the illumination beams. The lens assembly 220 may first collimate the illumination beams, and then converge the collimated illumination beams and emit the converged illumination beams to the reflector 230. The reflector 230 may reflect the illumination beams to the prism assembly 250. The prism assembly 250 reflects the illumination beams to the DMD 240, and the DMD 240 modulates the illumination beams to obtain the projection beams, and reflects the projection beams into the projection lens 300.

A function of the DMD 240 in the optical engine 200 is to modulate the illumination beams provided by the laser source 100 with image signals, that is, the DMD 240 controls the illumination beams to display different luminance according to different pixels of an image to be displayed, so as to finally form an optical image. Therefore, the DMD 240 is also referred to as an optical modulator or a light valve. Depending on whether the optical modulator transmits or reflects the illumination beams, the optical modulator may be classified as a transmissive optical modulator or a reflective optical modulator. For example, the DMD 240 shown in FIG. 13 reflects the illumination beams, thus it is a reflective optical modulator. A liquid crystal optical shutter (LCOS) transmits the illumination beams, thus it is a transmissive optical modulator.

Figure 14:
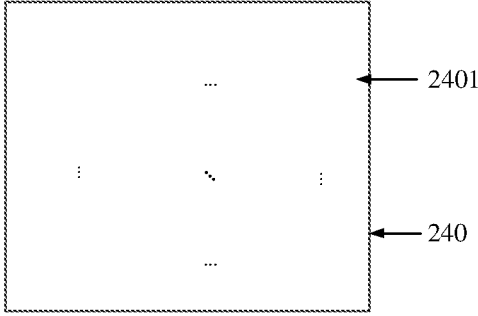
FIG. 14 is a diagram showing an arrangement of micromirrors in a digital micromirror device, in accordance with some embodiments.
Figure 15:
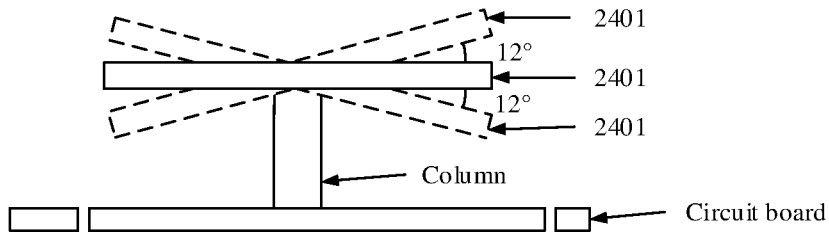
FIG. 15 is a diagram showing a swing position of a micromirror in the digital micromirror device shown in FIG. 14.

As shown in FIG. 14, the DMD 240 includes thousands of micromirrors 2401 that may be individually driven to rotate. These micromirrors 2401 are arranged in an array, and each micromirror 2401 corresponds to one pixel in the image to be displayed. As shown in FIG. 15, each micromirror 2401 is equivalent to a digital switch, and may swing in a range of plus or minus 12 degrees (i.e., ±12°) or a range of plus or minus 17 degrees (i.e., ±17°) due to an action of an external force.

Figure 16:
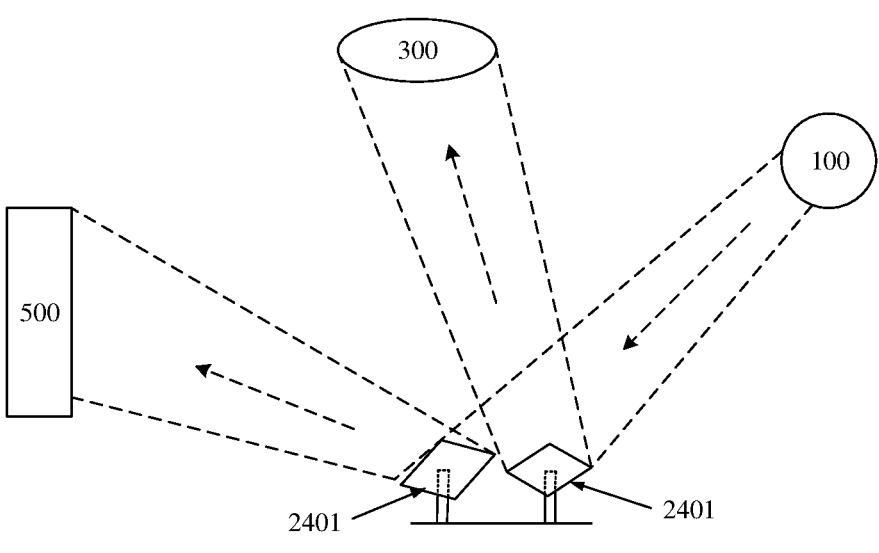
FIG. 16 is a schematic diagram showing an operation of a micromirror, in accordance with some embodiments.

As shown in FIG. 16, a beam reflected by a micromirror 2401 at a negative deflection angle is referred to as an OFF beam, which is an invalid beam, and usually irradiates on the shell of the optical engine 200 or is absorbed by a laser absorption unit 500. A beam reflected by a micromirror 2401 at a positive deflection angle is referred to as an ON beam, which is a valid beam reflected into the projection lens 300 after the micromirror 2401 on a surface of the DMD 240 is irradiated by an illumination beam, and is used for projecting into an image. An ON state of the micromirror 2401 is a state that the micromirror 2401 is in and may be maintained when the illumination beams emitted by the laser source 100 may enter the projection lens 300 after being reflected by the micromirror 2401. That is, the micromirror 2401 is in a state of a positive deflection angle. An OFF state of the micromirror 2401 is a state that the micromirror 2401 is in and may be maintained when the illumination beams emitted by the laser source 100 do not enter the projection lens 300 after being reflected by the micromirror 2401. That is, the micromirror 2401 is in a state of a negative deflection angle.

In a display cycle of a frame of image, part or all of the micromirrors 2401 may be switched once between the ON state and the OFF state, so that gray scales of pixels in the frame of image are achieved according to durations that the micromirrors 2401 are in the ON state and the OFF state. For example, in a case where the pixels have 256 gray scales from 0 to 255, micromirrors corresponding to a gray scale 0 are each in the OFF state in an entire display cycle of a frame of image, micromirrors corresponding to a gray scale 255 are each in the ON state in the entire display cycle of a frame of image, and micromirrors corresponding to a gray scale 127 are each in the ON state for a half of time and in the OFF state for the other half of time in the display cycle of a frame of image. Therefore, by controlling a state that each micromirror in the DMD 240 is in and a duration of each state in the display cycle of a frame of image with image signals, luminance (the gray scale) of a pixel corresponding to the micromirror 2401 may be controlled, and a purpose of modulating the illumination beams projected onto the DMD 240 may be achieved.

As shown in FIGS. 12 and 13, the light pipe 210, the lens assembly 220 and the reflector 230 in front of the DMD 240 form an illumination beam path. After passing through the illumination beam path, the illumination beams emitted by the laser source 100 are made to conform to a beam size and an incident angle required by the DMD 240.

As shown in FIG. 12, the projection lens 300 includes a combination of a plurality of lenses, which are usually divided by groups, and are divided into a three-segment combination including a front group, a middle group and a rear group, or a two-segment combination including a front group and a rear group. The front group is a lens group proximate to a laser-exit side of the laser projection apparatus (i.e., a side of the projection lens 300 away from the optical engine 200 in the direction N), and the rear group is a lens group proximate to a laser-exit side of the optical engine 200 (i.e., a side of the projection lens 300 proximate to the optical engine 200 in the direction N). The projection lens 300 may be a zoom lens, or a fixed focus-adjustable lens, or a fixed focus lens.

With the development of laser display technologies, laser devices are widely used. The light-emitting chips in a laser device usually generate a large amount of heat during the light-emitting process, and the heat is an important factor that causes the light-emitting chips to be damaged. Therefore, how to quickly conduct heat to the outside has become a key research point in the field of laser devices.

Generally, a heat sink may be provided in the laser device, and the heat sink is mounted on the bottom plate of the laser device, and the light-emitting chip is mounted on the side of the heat sink away from the bottom plate. The heat generated when the light-emitting chips emit light may be conducted to the outside through the heat sink, so as to avoid damage to the light-emitting chips caused by accumulation of the heat. However, the effect of conducting the heat generated by the light-emitting chips through the heat sink is poor. Some embodiments of the present disclosure provide a laser device, which may improve the heat conduction speed of a light-emitting chip.

Figure 2:
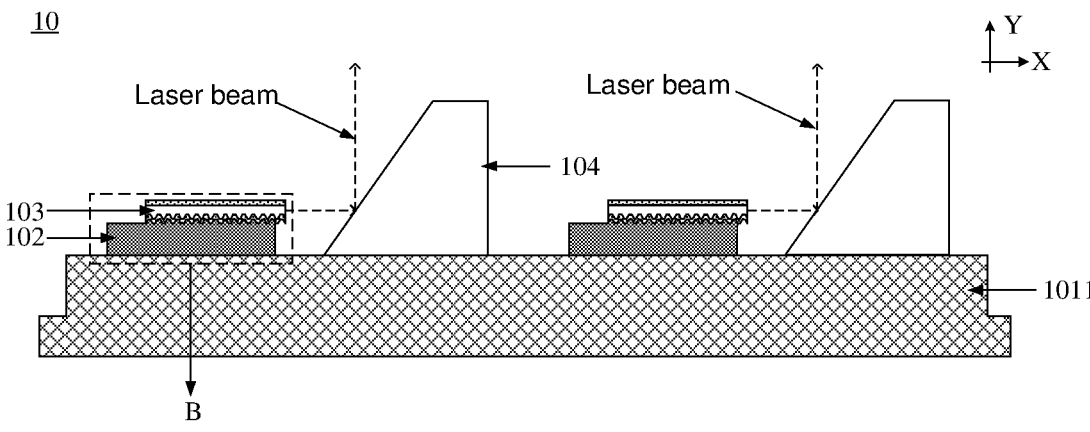
FIG. 2 is a partial sectional view of the laser device shown in FIG. 1 taken along the line A-A'.

The laser device 10 in the laser source 100 according to some embodiments of the present disclosure will be described in detail below. FIG. 1 is a structural diagram of a laser device, in accordance with some embodiments, and FIG. 2 is a partial sectional view of the laser device shown in FIG. 1 taken along the line A-A'. As shown in FIGS. 1 and 2, the laser device 10 includes a case 101, a heat sink 102, a light-emitting chip 103 and a reflecting prism 104. The case 101 includes a bottom plate 1011 and a frame body 1012, and the frame body 1012 and the bottom plate 1011 form an accommodating space with an opening. The heat sink 102 is located in the accommodating space and is fixed on the bottom plate 1011. The light-emitting chip 103 is fixed on a surface of the heat sink 102 away from the bottom plate 1011. The reflecting prism 104 is located on a light exit side of the light-emitting chip 103.

A surface of the bottom plate 1011 supporting the light-emitting chip 103 is an inner surface, and a surface of the bottom plate 1011 opposite to the inner surface is an outer surface. The bottom plate 1011 is made of a material with a large thermal conductivity, such as oxygen-free copper, so that the heat generated by the light-emitting chip 103 disposed on the bottom plate 1011 during operation may be quickly conducted to a heat dissipation structure outside the laser device 10, thereby dissipating heat quickly and avoiding damage to the light-emitting chip 103 caused by heat accumulation. In addition to oxygen-free copper, the material of the bottom plate 1011 may also be one or more of aluminum, aluminum nitride and silicon carbide.

In some embodiments, as shown in FIG. 1, the laser device 10 further includes conductive pins 109, and the conductive pin 109 is electrically connected to the light-emitting chip 103 to transmit external power to the light-emitting chip 103, thereby exciting the light-emitting chip 103 to emit laser light to the reflecting prism 104. The reflecting prism 104 reflects the incident laser light in a direction away from the bottom plate 1011, so that the laser device 10 emits light.

Figure 3:
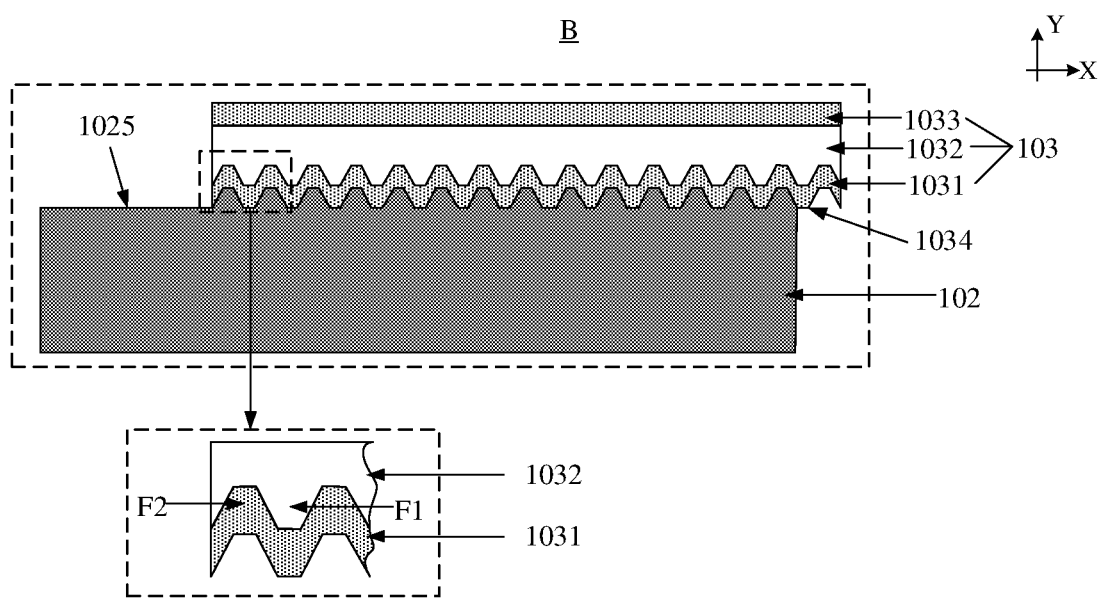
FIG. 3 is a partial enlarged view of part B in FIG. 2.

FIG. 3 is a partial enlarged view of part B in FIG. 2. As shown in FIGS. 2 and 3, the light-emitting chip 103 includes a plurality of first protrusions and/or a plurality of first depressions, and the plurality of first protrusions and/or the plurality of first depressions are located on a first surface 1034 of the light-emitting chip 103. The first surface 1034 is fixed to the heat sink 102, therefore, the first surface 1034 has a large expanded area, so that a contact area between the light-emitting chip 103 and the heat sink 102 is large. Furthermore, the light-emitting chip 103 may conduct heat to the heat sink 102 through the first surface 1034 with a large expanded area, thereby increasing the conduction speed of the heat.

In some embodiments, the plurality of first protrusions and/or the plurality of first depressions are distributed uniformly or randomly. The plurality of first protrusions and/or the plurality of first depressions may be distributed on all or a portion of the first surface 1034.

It will be noted that, in some embodiments, the plurality of first protrusions and the plurality of first depressions included in the light-emitting chip 103 are distributed at intervals. A shape and a size of a first protrusion are approximately the same as a shape and a size of a first depression, which may facilitate the fabrication of the plurality of first protrusions and/or the plurality of first depressions. As shown in FIG. 2, in a case where the shape and size of the first protrusion are approximately the same as the shape and size of the first depression, it can be considered that the light-emitting chip 103 includes a plurality of first protrusions, or, the light-emitting chip 103 includes a plurality of first depressions. But it is not limited to this, in the light-emitting chip 103, the shape or size of a first protrusion may be different from the shape or size of a first depression.

The heat sink 102 is used to assist in dissipating the heat generated by the light-emitting chip 103 when it emits light. The light-emitting chip 103 generates a large amount of heat when it emits light, and the heat may be conducted to the bottom plate 1011 through the heat sink 102, and then conducted to the heat dissipation structure outside the laser device 10, so as to avoid damage to the light-emitting chip 103 caused by heat accumulation.

In some embodiments, as shown in FIGS. 2 and 3, the heat sink 102 includes a plurality of second depressions and/or a plurality of second protrusions, and the plurality of second depressions and/or the plurality of second protrusions are located on a second surface 1025 of the heat sink 102. The second surface 1025 is fixed to the light-emitting chip 103, therefore, the second surface 1025 has a large expanded area, so that the contact area between the light-emitting chip 103 and the heat sink 102 is large. Furthermore, the light-emitting chip 103 may conduct heat to the heat sink 102 through the second surface 1025 with a large expanded area, thereby increasing the conduction speed of the heat. The shape and size of the first protrusion are the same as the shape and size of the second depression, and the shape and size of the second protrusion are the same as the shape and size of the first depression. In a case where the first surface 1034 of the light-emitting chip 103 is in contact with the second surface 1025 of the heat sink 102, the first protrusion is located in the second depression, and the second protrusion is located in the first depression, which is conducive to heat conduction between the light-emitting chip 103 and the heat sink 102. In some embodiments, the first protrusion is attached to the second depression, and the second protrusion is attached to the first depression, which is conducive to enhance the heat conduction efficiency between the light-emitting chip 103 and the heat sink 102.

A surface of the reflecting prism 104 facing the light-emitting chip 103 is a reflective surface, and the reflective surface is configured to reflect the laser light emitted by the light-emitting chip 103. In this way, a propagation direction of the laser beam emitted by the light-emitting chip 103 that is in parallel to the inner surface of the bottom plate 1011 is changed to be a direction perpendicular to the inner surface of the bottom plate 1011, and the laser beam is emitted from the light exit surface of the laser device 10.

In some embodiments, the laser device 10 includes a plurality of light-emitting chips 103, and the plurality of light-emitting chips 103 include a plurality of rows and/or a plurality of columns of light-emitting chips 103 arranged in an array on the bottom plate 1011. In some embodiments, the plurality of light-emitting chips 103 all emit the laser beam of a same color. Alternatively, the plurality of light-emitting chips 103 include a plurality of types of light-emitting chips 103, one type of light-emitting chips 103 is used to emit laser beam of a color, and the laser beams emitted by different types of light-emitting chips 103 are of different colors.

In some embodiments, a thickness of the light-emitting chip 103 is in a range from 40 μm to 100 μm. For example, the thickness of the light-emitting chip 103 is 40 μm, 45 μm, 55 μm, 60 μm, 65 μm, 70 μm, 80 μm, 90 μm or 100 μm. If the thickness of the light-emitting chip 103 is too small, for example, less than 40 μm, it is unfavorable to provide the plurality of first protrusions and/or the plurality of first depressions on the first surface 1034 of the light-emitting chip 103. However, if the thickness of the light-emitting chip 103 is too large, for example, greater than 100 μm, the heat will not be dissipated easily, and it is also not conducive to the miniaturization of the light-emitting chip.

The laser device 10 may include a plurality of heat sinks 102 and a plurality of reflecting prisms 104 corresponding to the plurality of light-emitting chips 103, and the plurality of heat sinks 102, the plurality of light-emitting chips 103 and the plurality of reflecting prisms 104 are arranged in an array on the bottom plate 1011. For example, a heat sink 102, a light-emitting chip 103 and a reflecting prism 104 form a light-emitting assembly. As shown in FIG. 1, the laser device 10 includes 4 rows of light-emitting assemblies in the direction X and 5 columns of light-emitting assemblies in the direction Z. That is, the laser device 10 includes 20 light-emitting assemblies arranged in an array on the bottom plate 1011, and the 20 light-emitting chips 103 in the 20 light-emitting assemblies all emit laser beams in the direction X. But it is not limited to this, the number of the plurality of light-emitting assemblies in the laser device 10 may vary according to the luminous efficiency required by the laser source 100 in the laser projection apparatus 1, for example, the number may be 16, 25 or the like.

In some embodiments, the plurality of heat sinks 102 in the laser device 10 are in a one-to-one correspondence with the plurality of light-emitting chips 103, that is, one light-emitting chip 103 is fixed on one heat sink 102. Signal lines and ground lines are arranged on the heat sink 102, and the signal lines and ground lines are connected to the light-emitting chip 103 to drive the light-emitting chip 103 to emit light. The arrangement of the plurality of independent heat sinks 102 in the laser device 10 improves the insulating effect and the electromagnetic shielding effect between the signal lines and the ground lines in one heat sink 102 and the signal lines and the ground lines in another heat sink 102. But it is not limited to this, in some embodiments, one heat sink 102 corresponds to at least two light-emitting chips 103. The at least two light-emitting chips 103 are adjacent and arranged in the direction Z shown in FIG. 1.

In some embodiments, the plurality of reflecting prisms 104 in the laser device 10 are in a one-to-one correspondence with the plurality of light-emitting chips 103, that is, one reflecting prism 104 is disposed on the light exit side of one light-emitting chip 103. The reflective surface of the reflecting prism 104 may be an inclined surface or a curved surface. By setting the reflective surface of the reflecting prism 104 to be a curved surface, it may be possible to reduce the divergence degree of the laser beam emitted by the light-emitting chip 103. In a case where the laser device 10 includes a plurality of reflecting prisms 104, the reflective surface of each reflecting prism 104 may be processed independently, thereby ensuring the manufacturing accuracy of the reflecting prisms 104.

But it is not limited to this, in some embodiments, one reflecting prism 104 corresponds to at least two light-emitting chips 103. The at least two light-emitting chips 103 are adjacent and located on a same side of the corresponding reflecting prism 104. The at least two light-emitting chips 103 are arranged in the direction Z shown in FIG. 1. In this case, the reflective surface of the reflecting prism 104 is configured to reflect the laser beams emitted by the at least two light-emitting chips 103.

In some embodiments, the at least two light-emitting chips 103 are located on different sides of the same reflecting prism 104. For example, the at least two light-emitting chips 103 are located on two opposite sides of the reflecting prism 104. In this case, the reflecting prism 104 is provided with reflective surfaces on two opposite sides thereof, and the reflective surface arranged on each side is used to reflect the laser beam emitted by the corresponding light-emitting chip 103.

As shown in FIG. 3, in some embodiments, the light-emitting chip 103 includes a first electrode 1031, a light-emitting layer 1032 and a second electrode 1033 that are sequentially stacked in a direction away from the bottom plate 1011 (i.e., the direction Yin FIG. 3).

The first electrode 1031 is fixed on a surface of the light-emitting layer 1032 proximate to the bottom plate 1011, the second electrode 1033 is fixed on a surface of the light-emitting layer 1032 away from the bottom plate 1011, the first electrode 1031 and the second electrode 1033 are electrically connected to an external power source through the conductive pins 109, so as to excite the light-emitting layer 1032 to emit laser light.

In some embodiments, there are a plurality of protrusions F1 and/or a plurality of depressions F2 on the surface of the light-emitting layer 1032 proximate to the bottom plate 1011. In this case, the first surface 1034 on which the first electrode 1031 is in contact with the heat sink 102 is an uneven surface.

In some embodiments, the protrusions F1 and the depressions F2 are formed by means of additive manufacturing (e.g., adding material). For example, the plurality of protrusions F1 are formed through a coating process, and a depression F2 is formed at a portion between two adjacent protrusions F1. For example, the main structure of the light-emitting layer 1032 is formed first, then micro-particles are sprayed on a surface of the main structure of the light-emitting layer 1032 proximate to the bottom plate 1011, so that there are a plurality of protrusions on the surface, so as to obtain the plurality of protrusions F1. It will be noted that, "micro" refers to a size of the micron level, and a micro-particle refers to a particle with a diameter of the micron level. For example, a diameter of the micro-particle is 0.1 μm, 0.2 μm, 0.5 μm, 1.0 μm or 2.0 μm. A height of the protrusion F1 formed by these micro-particles is in a range from 0.5 μm to 10 μm. For example, the height of the protrusion F1 is 0.5 μm, 0.6 μm, 0.8 μm, 1.0 μm, 1.5 μm, 2.0 μm, 3.0 μm, 6.0 μm, 9.5 μm or 10 μm. The plurality of protrusions F1 are manufactured through a coating process, it may be possible to reduce the costs on the basis of ensuring the requirement of dimensional accuracy.

In some embodiments, the depressions F2 and the protrusions F1 are formed by means of subtractive manufacturing (e.g., reducing material). For example, the plurality of depressions F2 are formed by a surface roughening technique, and a protrusion F1 is formed at the portion between two adjacent depressions F2. For example, the main structure of the light-emitting layer 1032 is formed first, then the surface of the main structure of the light-emitting layer 1032 proximate to the bottom plate 1011 is roughened by an etching process; or, the surface of the main structure of the light-emitting layer 1032 proximate to the bottom plate 1011 is machined (e.g., stamped), so that there are a plurality of grooves on the surface, so as to obtain the plurality of depressions F2. A depth of the depression F2 is in a range from 0.5 μm to 10 μm. For example, the depth of the depression F2 is 0.5 μm, 0.6 μm, 0.8 μm, 1.0 μm, 1.5 μm, 2.0 μm, 3.0 μm, 6.0 μm, 9.5 μm or 10 μm.

In some embodiments, the main structure of the light-emitting layer 1032 is formed first, then the plurality of depressions F2 are formed on the surface of the main structure of the light-emitting layer 1032 proximate to the bottom plate 1011 after the plurality of protrusions F1 are formed on that surface, or, the plurality of protrusions F1 are formed on the surface of the main structure of the light-emitting layer 1032 proximate to the bottom plate 1011 after the plurality of depressions F2 are formed on that surface. For the formation of the plurality of protrusions F1 and the plurality of depressions F2, reference may be made to the above description, and details will not be repeated herein.

When the plurality of protrusions F1 or the plurality of depressions F2 are formed in the manner as described above, heights of the plurality of protrusions F1 or depths of the plurality of depressions F2 may not meet the expected requirements due to limitations such as material, structure, device, time, temperature and cost. However, when the plurality of protrusions F1 in the light-emitting layer 1032 are formed by means of additive manufacturing, and the plurality of depressions F2 are formed by means of subtractive manufacturing, it may be possible to increase the heights of the plurality of protrusions F1 or increase the depths of the plurality of depressions F2, that is to say, it may be possible to increase a distance between a surface of the plurality of protrusions F1 proximate to the bottom plate 1011 and a surface of the plurality of depressions F2 proximate to the bottom plate 1011, thereby increasing a contact area between the light-emitting chip 103 and the heat sink 102, which is further conducive to heat conduction between the light-emitting chip 103 and the heat sink 102.

In some embodiments, the distance between the surface of the plurality of protrusions F1 proximate to the bottom plate 1011 and the surface of the plurality of depressions F2 proximate to the bottom plate 1011 is in a range from 0.5 μm to 20 μm. For example, the distance is 0.5 μm, 1.0 μm, 2.5 μm, 5.0 μm, 9.5 μm, 10 μm, 12 μm, 15 μm, 18 μm or 20 μm. This range may not only ensure the contact area between the light-emitting chip 103 and the heat sink 102, but also will not increase the difficulty in manufacturing the plurality of protrusions F1 or the plurality of depressions F2.

It will be noted that, some embodiments of the present disclosure take an example in which the first electrode 1031 covers the entire surface of the light-emitting layer 1032 proximate to the bottom plate 1011, and the second electrode 1033 covers the entire surface of the light-emitting layer 1032 away from the bottom plate 1011. In this case, the first electrode 1031 and the second electrode 1033 may generate more carriers under the action of the applied voltage, and the carriers may excite the light-emitting layer 1032 to emit light, thereby improving the light-emitting efficiency of the light-emitting chip 103. But it is not limited this, in some embodiments, the first electrode 1031 only covers a partial region of the surface of the light-emitting layer 1032 proximate to the bottom plate 1011, and the second electrode 1033 only covers a partial region of the surface of the light-emitting layer 1032 away from the bottom plate 1011. For example, the partial region is a central region of the surface of the light-emitting layer 1032 proximate to the bottom plate 1011 or a central region of the surface of the light-emitting layer 1032 away from the bottom plate 1011.

In some embodiments, a thickness of the first electrode 1031 is in a range from 50 nm to 300 nm. For example, the thickness of the first electrode 1031 is 50 nm, 75 nm, 100 nm, 150 nm, 200 nm or 300 nm. The first electrode 1031 may be manufactured by methods such as magnetron sputtering or vapor deposition, thus the first electrode 1031 formed is not only small in thickness, but also has approximately the same thickness at each position. Therefore, the first surface 1034 of the light-emitting chip 103 is of a shape formed by the plurality of protrusions F1 and the plurality of depressions F2 in the light-emitting layer 1032.

Since the thickness of the first electrode 1031 is small, the first electrode 1031 may not flatten the plurality of depressions F2 on the surface of the light-emitting layer 1032 proximate to the bottom plate 1011. Therefore, the region of the first electrode 1031 corresponding to the depressions F2 is recessed in a direction proximate to the light-emitting layer 1032, and the region of the first electrode 1031 corresponding to the protrusions F1 is convex in a direction away from the light-emitting layer 1032. Furthermore, the first surface 1034 of the first electrode 1031 away from the light-emitting layer 1032 forms an uneven surface, that is, the first surface 1034 of the first electrode 1031 away from the light-emitting layer 1032 forms the plurality of first protrusions and/or the plurality of first depressions.

In some embodiments, an absolute value of the thickness difference of the first electrode 1031 at each position is less than or equal to a thickness threshold, so that the first electrode 1031 is a film with a relatively uniform thickness, thereby improving the current conduction efficiency of the first electrode 1031. The thickness threshold is in a range from 5 nm to 10 nm. For example, the thickness thresholds is 5 nm, 5.5 nm, 6.5 nm, 8 nm or 10 nm; or, the thickness threshold is 0, that is, the first electrode 1031 is of a same thickness at each position.

Figure 4:
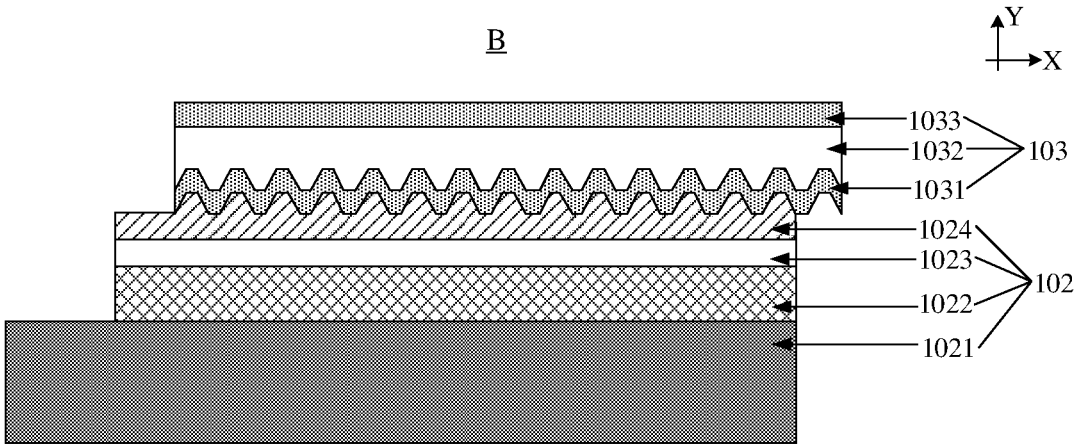
FIG. 4 is another partial enlarged view of part B in FIG. 2.

FIG. 4 is another partial enlarged view of the part B in FIG. 2. Only the differences between the part B shown in FIG. 4 and the part B shown in FIG. 3 will be described below, and their similarities will not be repeated herein. It will be noted that, similar/identical components and/or features in the accompanying drawings may be represented by the same reference numerals. As shown in FIG. 4, in some embodiments, the heat sink 102 includes a heat dissipation substrate 1021, a solder mask 1022, a conductive layer 1023 and a solder layer 1024 that are sequentially stacked in the direction away from the bottom plate 1011 (i.e., the direction Y in FIG. 4).

The solder layer 1024 is configured to solder the light-emitting chip 103. In some embodiments, a material of the solder layer 1024 includes tin solder. The conductive layer 1023 is configured to be electrically connected to the light-emitting chip 103 through the solder layer 1024. For example, the conductive layer 1023 includes the signal lines and ground lines as described above, and an external power source may be electrically connected to the conductive layer 1023 through the conductive pins 109, so that the first electrode 1031 is electrically connected to the external power source through the solder layer 1024 and the conductive layer 1023. In some embodiments, a material of the conductive layer 1023 includes gold, silver or other metals.

The solder mask 1022 is configured to prevent ions in the conductive layer 1023 from diffusing into the heat dissipation substrate 1021, so as to avoid affecting the characteristics of the heat dissipation substrate 1021. In some embodiments, a material of the solder mask 1022 includes one or more of platinum, palladium, titanium-platinum-gold mixture and copper-nickel-gold mixture.

The heat dissipation substrate 1021 is configured to conduct heat generated by the light-emitting chip 103 to the bottom plate 1011. In some embodiments, the heat dissipation substrate 1021 is made of a material of a high thermal conductivity, such as oxygen-free copper or ceramic. It will be noted that, ceramic has good thermal conductivity, high heat dissipation efficiency and good thermal stability. By manufacturing the heat dissipation substrate 1021 with ceramic, it may be possible to quickly conduct the heat generated during the operation of the light-emitting chip 103 to the heat dissipation structure outside the laser device 10 through the heat sink 102 and the bottom plate 1011, so as to dissipate heat quickly, and avoid damage to the light-emitting chip 103 caused by heat accumulation. In addition to ceramic and oxygen-free copper, the material of the heat dissipation substrate 1021 may also be one or more of aluminum, aluminum nitride and silicon carbide.

In some embodiments, when assembling the heat sink 102 and the light-emitting chip 103, the light-emitting chip 103 is placed on the solder layer 1024 in the heat sink 102, and then the solder layer 1024 is heated to melt the solder layer 1024. The solder layer 1024 that is melted is in full contact with the first surface 1034 of the first electrode 1031 in the light-emitting chip 103, and fills the depressions in the first surface 1034 of the first electrode 1031. After the solder layer 1024 is cured, the shape of the second surface 1025 of the solder layer 1024 is fitted to the shape of the first surface 1034 of the first electrode 1031, and the plurality of second depressions and/or the plurality of second protrusions are formed on the second surface 1025 of the solder layer 1024, so as to complete assembly of the heat sink 102 and the light-emitting chip 103.

In some embodiments, as shown in FIG. 3 or FIG. 4, an end of the light-emitting chip 103 proximate to the reflecting prism 104 protrudes relative to an end of the heat sink 102 proximate to the reflecting prism 104. The laser beam emitted by the light-emitting chip 103 has a divergence angle, the light-emitting chip 103 is closer to the reflecting prism 104 when the light-emitting chip 103 protrudes from the heat sink 102, which ensures more of the laser beam emitted by the light-emitting chip 103 may irradiate on the reflecting prism 104, and avoid a waste of laser beams as the laser beams emitted by the light-emitting chips irradiate on the bottom plate 1011, so that the laser beams emitted by the laser device 10 have a high luminance.

However, the end of the light-emitting chip 103 proximate to the reflecting prism 104 should not protrude too much relative to the end of the heat sink 102 proximate to the reflecting prism 104. Since the portion of the light-emitting chip 103 protruding from the heat sink 102 cannot be attached to the heat sink 102, the heat generated by the portion of the light-emitting chip 103 that is not attached to the heat sink 102 cannot be conducted through the heat sink 102. Therefore, if the end of the light-emitting chip 103 proximate to the reflecting prism 104 protrudes too much relative to the end of the heat sink 102 proximate to the reflecting prism 104, which may cause the heat to be conducted slowly at the portion where the end of the light-emitting chip 103 proximate to the reflecting prism 104 protrudes, thus the light-emitting chip 103 has a poor heat dissipation effect. Therefore, in some embodiments, a length of the portion of the light-emitting chip 103 protruding from the heat sink 102 is less than or equal to 15 μm in the direction X as shown in FIGS. 3 and 4. For example, the length of the portion is 1 μm, 2 μm, 2.5 μm, 5 μm, 6 μm, 8.5 μm, 9.5 μm, 10 μm, 13 μm or 15 μm.

However, it is not limited to this. In some embodiments, the ends of at least some light-emitting chips 103 in the laser device proximate to the reflecting prism 104 are flush with the ends of corresponding heat sinks 102 proximate to the reflecting prism 104, or the ends of all light-emitting chips 103 in the laser device proximate to the reflecting prism 104 are flush with the ends of all heat sinks 102 proximate to the reflecting prism 104.

In a case where the end of the light-emitting chip 103 proximate to the reflecting prism 104 is flush with the end of the heat sink 102 proximate to the reflecting prism 104, the contact area between the light-emitting chip 103 and the heat sink 102 is relatively large, thereby increasing the area of the region of the heat sink 102 that is used for supporting the light-emitting chip 103, and further improving the firmness of the light-emitting chip 103. Meanwhile, since the contact area between the light-emitting chip 103 and the heat sink 102 is relatively large, it may be possible to further improve the heat conduction effect of the heat sink 102, and further improve the heat dissipation capability of the laser device.

Figure 5:
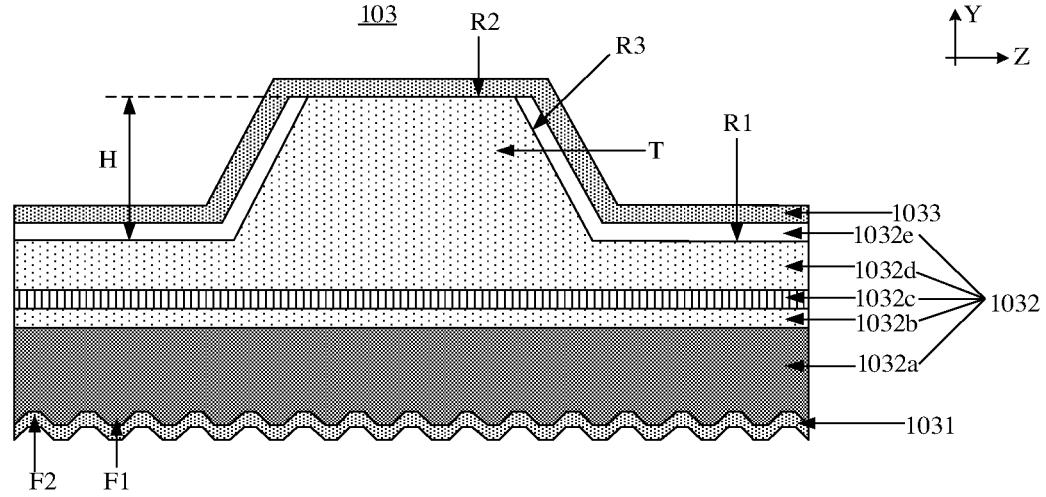
FIG. 5 is a structural diagram of a light-emitting chip, in accordance with some embodiments.

FIG. 5 is a structural diagram of a light-emitting chip, in accordance with some embodiments, and the light-emitting chip 103 shown in FIG. 5 may be a left side view of the light-emitting chip 103 shown in FIG. 3. The direction Z in FIG. 5 is perpendicular to the direction X and the direction Y. For example, the direction Z is an arrangement direction of five columns of light-emitting chips 103 shown in FIG. 1. As shown in FIG. 5, in some embodiments, the light-emitting chip 103 includes the first electrode 1031, the light-emitting layer 1032 and the second electrode 1033 that are sequentially stacked in the direction away from the bottom plate 1011 (i.e., the direction Y in FIG. 5). The light-emitting layer 1032 includes a substrate 1032a, a first semiconductor layer 1032b, an active layer 1032c, a second semiconductor layer 1032d and an insulating layer 1032e that are sequentially stacked in the direction away from the bottom plate 1011.

The insulating layer 1032e covers a first region R1 in the second semiconductor layer 1032d. The second semiconductor layer 1032d has a protruding portion T, a thickness of the insulating layer 1032e is less than a height of the protruding portion T, and the insulating layer 1032e does not cover a surface of the protruding portion T away from the bottom plate 1011 (i.e., the insulating layer 1032e does not cover the second region R2 in the second semiconductor layer 1032d). The height H of the protruding portion T refers to a distance between the first region R1 and the second region R2 on the surface of the second semiconductor layer 1032d away from the substrate 1032a. The insulating layer 1032e further covers a third region R3 in the second semiconductor layer 1032d between the first region R1 and the second region R2.

In some embodiments, the substrate 1032a is in contact with the first electrode 1031, that is, the substrate 1032a is disposed proximate to the bottom plate 1011, and the plurality of protrusions F1 and the plurality of depressions F2 are provided on a surface of the substrate 1032a proximate to the bottom plate 1011. The light-emitting chip 103 is mounted on the heat sink 102 in a manner that the substrate 1032a is disposed proximate to the bottom plate 1011, and the light-emitting chip 103 is referred to as a light-emitting chip of an upright structure.

It will be noted that, FIG. 5 shows an example in which the plurality of protrusions F1 and the plurality of depressions F2 are arranged on the entire surface of the substrate 1032a proximate to the bottom plate 1011, and the entire first surface 1034 of the first electrode 1031 proximate to the bottom plate 1011 is an uneven surface. But it is not limited to this, in some embodiments, the plurality of protrusions F1 and the plurality of depressions F2 are only arranged in a partial region of the surface of the substrate 1032a proximate to the bottom plate 1011, and an orthogonal projection of the partial region on the bottom plate 1011 covers an orthogonal projection of the second region R2 in the second semiconductor layer 1032d on the bottom plate 1011, and the second region R2 is a region in the second semiconductor layer 1032d that is not covered by the insulating layer 1032e.

In some embodiments, a material of the first semiconductor layer 1032b is negative-type semiconductor, which is also referred to as electron-type semiconductor; a material of the second semiconductor layer 1032d is positive-type semiconductor, which is also referred to as hole-type semiconductor. In the light-emitting chip 103, the first electrode 1031 that is in contact with the first semiconductor layer 1032b is an N electrode, i.e., the negative electrode; the second electrode 1033 that is in contact with the second semiconductor layer 1032*d* is a P electrode, i.e., the positive electrode.

In some embodiments, the light-emitting layer 1032 further includes an N-type blocking layer located between the first semiconductor layer 1032*b* and the active layer 1032*c*, and a P-type blocking layer located between the second semiconductor layer 1032*d* and the active layer 1032*c*. The N-type blocking layer and the P-type blocking layer may each be referred to as a photon confinement layer, and are used to prevent photons in the active layer 1032*c* from moving in directions toward the first electrode 1031 and the second electrode 1033.

It will be note that, the light-emitting chip 103 is an optoelectronic device that emits coherent radiation beams when current is injected. The light-emitting principle of the light-emitting chip 103 will be described below by taking the light-emitting chip 103 shown in FIG. 5 as an example.

In the light-emitting chip 103 shown in FIG. 5, the first electrode 1031 is the N electrode, and the second electrode 1033 is the P electrode. The first electrode 1031 is connected to the negative electrode of an external power source, and the second electrode 1033 is connected to the positive electrode of the external power source, so as to inject current into the light-emitting layer 1032.

Under the action of the current, the electrons in the first semiconductor layer 1032*b* move to the active layer 1032*c*, and the holes in the second semiconductor layer 1032*d* move to the active layer 1032*c*, thereby increasing densities of the electrons and holes in the active layer 1032*c*. Both electrons and holes are called carriers. Photons are excited after the electrons and holes in the active layer 1032*c* are recombined. The photons are oscillated and reflected between the P-type blocking layer and the N-type blocking layer on two sides of the active layer 1032*c*, so that the radiation energy of the photons is increased, then the laser beam is output from the active layer 1032*c*. Since the second electrode 1033 only covers the second region R2 in the second semiconductor layer 1032*d* (i.e., the second electrode 1033 only covers the surface of the protruding portion T away from the bottom plate 1011), only the second region R2 in the second semiconductor layer 1032*d* may inject holes into the active layer 1032*c*, so that a region corresponding to the second region in the active layer 1032*c* may emit laser beams. Therefore, the light-emitting region of the light-emitting chip 103 is the region corresponding to the second region in the active layer 1032*c*.

The light-emitting region of the light-emitting chip 103 generates heat when it emits light, and the heat is conducted in an arrangement direction of various components of the light-emitting chip 103. Therefore, the heat may be conducted to the heat sink 102 through a region of the first electrode 1031 corresponding to the light-emitting region. An orthogonal projection of a region corresponding to the light-emitting region in the first electrode 1031 on the bottom plate 1011 coincides with an orthogonal projection of the light-emitting region on the bottom plate 1011.

In some embodiments, the plurality of protrusions F1 and the plurality of depressions F2 are arranged on a partial region of the surface of the light-emitting layer 1032 proximate to the bottom plate 1011, which is different from that the plurality of protrusions F1 and the plurality of depressions F2 shown in FIG. 5 are arranged on the entire surface of the substrate 1032*a* proximate to the bottom plate 1011, so that a region (i.e., a region corresponding to the light-emitting region in the first surface 1034 of the first electrode 1031 proximate to the bottom plate 1011) corresponding to the partial region in the first surface 1034 of the first electrode 1031 proximate to the bottom plate 1011 is uneven. In the region corresponding to the light-emitting region in the first surface 1034 of the first electrode 1031 proximate to the bottom plate 1011, the plurality of protrusions F1 and the plurality of depressions F2 increase the heat dissipation area of the light-emitting chip 103, and improve the conduction speed of the heat generated by the light-emitting chip 103.

It will be noted that, the heat may also be conducted in other directions, in a case where the plurality of protrusions F1 and the plurality of depressions F2 are arranged on the entire surface of the light-emitting layer 1032 proximate to the bottom plate 1011, that is, arranged on the entire surface of the substrate 1032*a* proximate to the bottom plate 1011, the entire first surface of the first electrode 1031 proximate to the bottom plate 1011 may be made to be an uneven surface, so as to further improve the heat dissipation area of the light-emitting chip 103, and further improve the conduction speed of the heat generated by the light-emitting chip 103.

Figure 6:
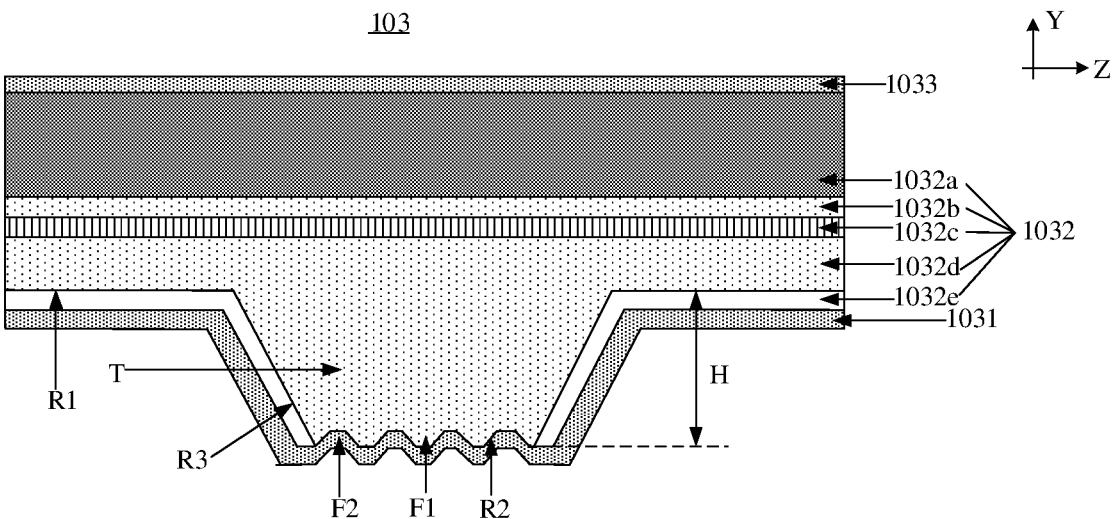
FIG. 6 is a structural diagram of another light-emitting chip, in accordance with some embodiments.

FIG. 6 is a structural diagram of another light-emitting chip, in accordance with some embodiments, and the light-emitting chip 103 shown in FIG. 6 is a left side view of the light-emitting chip 103 shown in FIG. 3. Only the differences between the light-emitting chip 103 shown in FIG. 6 and the light-emitting chip 103 shown in FIG. 5 will be described below, and their similarities will not be repeated herein. As shown in FIG. 6, the light-emitting layer 1032 includes the insulating layer 1032*e*, the second semiconductor layer 1032*d*, the active layer 1032*c*, the first semiconductor layer 1032*b* and the substrate 1032*a* that are sequentially stacked in the direction away from the bottom plate 1011.

The insulating layer 1032*e* is in contact with the first electrode 1031, that is, the insulating layer 1032*e* is disposed proximate to the bottom plate 1011. The insulating layer 1032*e* covers the first region R1 in the second semiconductor layer 1032*d*, and the protruding portion T is provided on the surface of the second semiconductor layer 1032*d* proximate to the bottom plate. The thickness of the insulating layer 1032*e* is less than the height of the protruding portion T, and the insulating layer 1032*e* does not cover the surface of the protruding portion T proximate to the bottom plate 1011 (i.e., the insulating layer 1032*e* does not cover the second region R2 in the second semiconductor layer 1032*d*). The insulating layer 1032*e* further covers a third region R3 in the second semiconductor layer 1032*d* between the first region R1 and the second region R2.

The plurality of protrusions F1 and the plurality of depressions F2 are provided on the surface of the protruding portion T proximate to the bottom plate 1011. The light-emitting chip 103 is mounted on the heat sink 102 in a manner that the substrate 1032*a* is disposed away from the bottom plate 1011, and the light-emitting chip 103 is referred to as a light-emitting chip of an inverted structure.

It will be noted that, the light-emitting region of the light-emitting chip 103 is located in the active layer 1032*c*, and a distance between the first electrode 1031 of the light-emitting chip 103 that is located on a side of the insulating layer 1032*e* away from the substrate 1032*a* and the active layer 1032*c* is relatively short. Therefore, by fixing the first electrode 1031 on the side of the insulating layer 1032*e* away from the substrate 1032*a* to the heat sink 102 (i.e., adopting the light-emitting chip of the inverted structure shown in FIG. 6), it may be possible to make the heat generated by the light-emitting region of the light-emitting chip 103 when emitting light conducted to the heat sink 102 through a short path, so as to improve a conduction speed of the heat to the outside of the laser device through the heat sink 102, and further improve the heat dissipation effect of the laser device.

It will be noted that, FIG. 6 shows an example in which the plurality of protrusions F1 and the plurality of depressions F2 are only located on the surface of the protruding portion T proximate to the bottom plate 1011, and a partial region of the first surface 1034 of the first electrode 1031 proximate to the bottom plate 1011 is an uneven surface. But it is not limited to this, in some embodiments, the plurality of protrusions F1 and the plurality of depressions F2 are provided on a surface of the insulating layer 1032e proximate to the bottom plate 1011, so that the entire first surface 1034 of the first electrode 1031 proximate to the bottom plate 1011 is an uneven surface.

Figure 7:
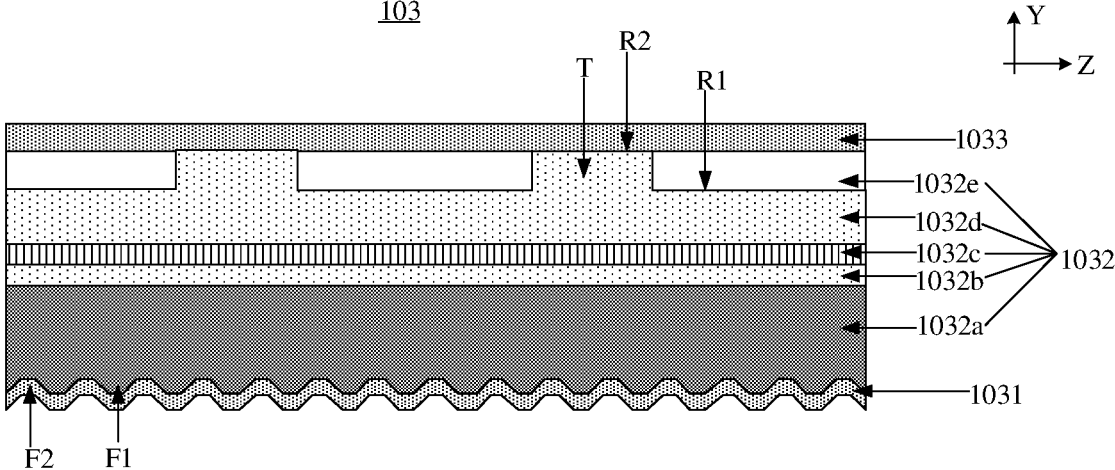
FIG. 7 is a structural diagram of yet another light-emitting chip, in accordance with some embodiments.
Figure 8:
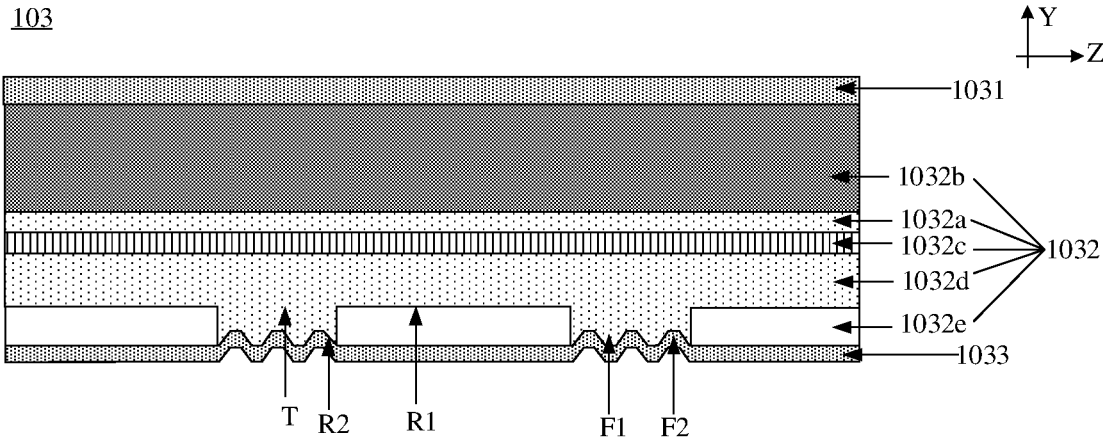
FIG. 8 is a structural diagram of yet another light-emitting chip, in accordance with some embodiments.

FIG. 7 is a structural diagram of yet another light-emitting chip, in accordance with some embodiments, and FIG. 8 is a structural diagram of yet another light-emitting chip, in accordance with some embodiments. The light-emitting chip 103 shown in FIG. 7 has a same arrangement manner of various film layers as the light-emitting chip 103 shown in FIG. 5, and the light-emitting chip 103 shown in FIG. 8 has a same arrangement manner of various film layers as the light-emitting chip 103 shown in FIG. 6.

As shown in FIGS. 7 and 8, the thickness of the insulating layer 1032e is equal to the height of the protruding portion T. The height H of the protruding portion T refers to a distance between the first region R1 and the second region R2 in the surface of the second semiconductor layer 1032d away from the substrate 1032a. The light-emitting chip 103 shown in FIGS. 7 and 8 is referred to as a light-emitting chip of a gain strip-shaped waveguide. The light-emitting chip 103 shown in FIGS. 5 and 6 is referred to as a light-emitting chip of a ridge-shaped waveguide.

It will be noted that, the arrangement manner of the plurality of protrusions F1 and the plurality of depressions F2 in the light-emitting chip 103 shown in FIG. 7 is the same as the arrangement manner of the plurality of protrusions F1 and the plurality of depressions F2 in the light-emitting chip 103 shown in FIG. 5, and the arrangement manner of the plurality of protrusions F1 and the plurality of depressions F2 in the light-emitting chip 103 shown in FIG. 8 is the same as the arrangement manner of the plurality of protrusions F1 and the plurality of depressions F2 in the light-emitting chip 103 shown in FIG. 6, and details will not be repeated herein. In the laser device, the light-emitting chip 103 shown in FIG. 7 and the light-emitting chip 103 shown in FIG. 5 may be replaced with each other, and the light-emitting chip 103 shown in FIG. 8 and the light-emitting chip 103 shown in FIG. 6 may also be replaced with each other.

In some embodiments, as shown in FIGS. 7 and 8, two protruding portions T are provided on the surface of the second semiconductor layer 1032d away from the substrate 1032a, and a region of the second semiconductor layer 1032d that is not covered by the insulating layer 1032e includes two independent second regions R2, which are surfaces of the two protruding portions T away from the substrate 1031a. Therefore, the light-emitting chip 103 has two light-emitting regions, thus the light-emitting chip 103 may emit two laser beams. It will be noted that, the second semiconductor layer 1032d in the light-emitting chip 103 shown in FIGS. 7 and 8 may have only one protruding portion T, which is not limited in the present disclosure.

The smaller the width of each light-emitting region, or the larger the distance between the two light-emitting regions, the better the heat will be dissipated. However, if the width of each light-emitting region is too small, or the distance between the two light-emitting regions is too large, the arrangement density of the plurality of light-emitting regions will be affected, thereby affecting the light-emitting efficiency of the light-emitting chip 103. In some embodiments, the width of each light-emitting region in the direction Z is 50 μm, 55 μm, 60 μm, 65 μm, 70 μm or 80 μm, and the distance between the two light-emitting regions is 80 μm, 90 μm, 100 μm, 110 μm or 130 μm.

In some embodiments, the laser device includes light-emitting chips 103 for emitting red laser beams, light-emitting chips 103 for emitting green laser beams, and light-emitting chips 103 for emitting blue laser beams. Generally, each laser beam emitted by the laser device is required to be mixed into the white laser beam by the human eyes through the phenomenon of persistence of vision. When the red laser beam, the green laser beam and the blue laser beam are mixed into the white laser beam through the phenomenon of persistence of vision, the proportion of the red laser beam needs to be relatively large. For example, a ratio of the red laser beam, the green laser beam and the blue laser beam in the mixed white laser beam is 2:1:1. Therefore, in some embodiments, the light-emitting chip 103 for emitting the red laser beam in the laser device may have two light-emitting regions, and the light-emitting chip 103 for emitting the blue laser beam and the light-emitting chip 103 for emitting the green laser beam may each have one light-emitting region.

In some embodiments, when manufacturing the light-emitting chip 103, the substrate 1032a is provided first, and the material of the substrate 1032a is related to the color of the laser beam emitted by the light-emitting chip 103. For example, in a case where the material of the substrate includes gallium nitride, the laser beam emitted by the light-emitting chip 103 is the red laser beam; in a case where the material of the substrate includes gallium arsenide, the laser beam emitted by the light-emitting chip 103 is the blue laser beam or the green laser beam.

Then, an N-type semiconductor layer (i.e., the first semiconductor layer 1032b), the active layer 1032c and a P-type semiconductor layer (i.e., the second semiconductor layer 1032d) are sequentially grown on the surface of the substrate 1032a by means of crystal growth. The material of the second semiconductor layer 1032d includes indium tin oxide (ITO) or other P-type semiconductor materials. Indium tin oxide is transparent, thus the laser beam emitted by the light-emitting chip 103 may be emitted through the second semiconductor layer 1032d. Then, the second semiconductor layer 1032d is etched, so that there are one or more protruding portions T on the surface of the second semiconductor layer 1032d away from the substrate 1032a after the second semiconductor layer 1032d is etched. Then, the insulating layer 1032e is formed on the second semiconductor layer 1032d having the protruding portion T, so that the insulating layer 1032e covers other regions other than the surface of the protruding portion T away from the substrate 1032a. The material of the insulating layer 1032e includes silicon dioxide or other insulating materials.

Then, the surface of the protruding portion T away from the substrate 1032a is etched to form a plurality of depressions F2 on the surface of the protruding portion T away from the substrate 1032a; or micro-particles are coated on the surface of the protruding portion T away from the substrate 1032a, so as to form a plurality of protrusions F1 on that surface; thereby obtaining the light-emitting layer 1032 shown in FIG. 6 or FIG. 8.

Alternatively, the surface of the substrate 1032*a* away from the first semiconductor layer 1032*b* is etched to form the plurality of depressions F2 on the surface; or microparticles are coated on the surface of the substrate 1032*a* away from the first semiconductor layer 1032*b*, so as to form the plurality of protrusions F1 on that surface; thereby obtaining the light-emitting layer of the light-emitting chip in FIG. 5 or FIG. 7.

Finally, a metal film is evaporated on a side of the protruding portion T away from the substrate 1032*a* to form the second electrode 1033, and a metal film is evaporated on a side of the substrate 1032*a* away from the first semiconductor layer 1032*b* to form the first electrode 1031, thus the light-emitting chip 103 is manufactured.

Figure 9:
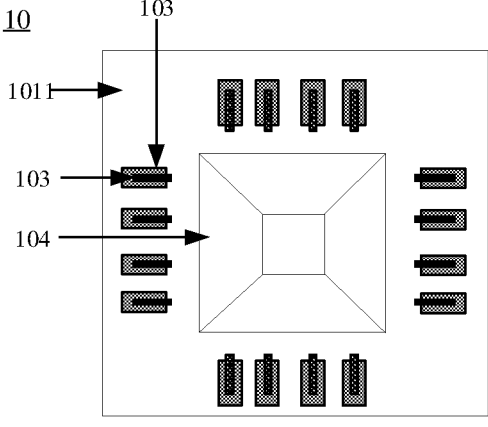
FIG. 9 is a structural diagram of another laser device, in accordance with some embodiments.

FIG. 9 is a structural diagram of another laser device, in accordance with some embodiments, and FIG. 9 may be a top view of the laser device 10. Only the differences between the laser device 10 shown in FIG. 9 and the laser device 10 shown in FIG. 1 will be described below, and their similarities will not be repeated herein. As shown in FIG. 9, the laser device 10 includes a case 101, a plurality of light-emitting chips 103, a plurality of heat sinks 102 corresponding to the plurality of light-emitting chips 103, and a reflecting prism 104.

FIG. 9 shows an example in which the laser device 10 includes only one reflecting prism 104, and the plurality of light-emitting chips 103 in the laser device 10 all correspond to a same reflecting prism 104. As shown in FIG. 9, the reflecting prism 104 is in a shape of a regular quadrangular pyramid and is located in the central region of the bottom plate 1011. The plurality of light-emitting chips 103 and the plurality of heat sinks 102 are located in the peripheral region of the bottom plate 1011, and the central region is surrounded by the peripheral region. For example, the plurality of light-emitting chips 103 in the laser device 10 are enclosed to form a rectangle and surround the reflecting prism 104. Four side surfaces of the reflecting prism 104 are all reflective surfaces, and the reflective surfaces are used to reflect the laser beam emitted by the light-emitting chip 103 toward the reflective surfaces, and emit the laser beam in the direction away from the bottom plate 1011.

But it is not limited to this, in some embodiments, the reflecting prism 104 is located in the peripheral region of the bottom plate 1011, and the plurality of light-emitting chips 103 and the plurality of heat sinks are located in the central region of the bottom plate 1011. Alternately, in some embodiments, one light-emitting chip 103 corresponds to one independent reflecting prism 104.

It will be noted that, FIG. 9 is only used to illustrate an arrangement manner of the light-emitting chips 103 in the laser device 10. The structure and features of the laser device 10 and the structure and features of any components included in the laser device 10 may be referred to descriptions corresponding to FIGS. 1 to 8, and details will not be repeated herein.

Figure 10:
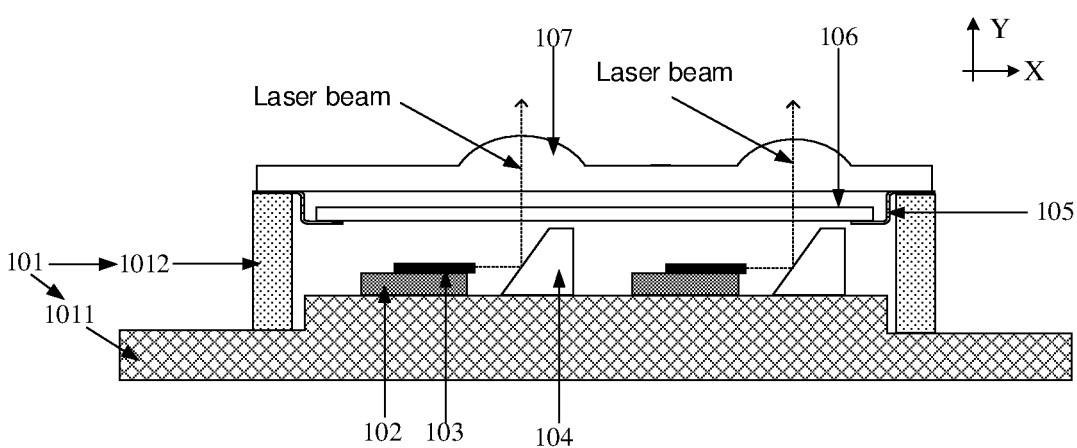
FIG. 10 is a structural diagram of yet another laser device, in accordance with some embodiments.

FIG. 10 is a structural diagram of yet another laser device, in accordance with some embodiments. Only the differences between the laser device 10 shown in FIG. 10 and the laser device 10 shown in FIG. 1 will be described below, and their similarities will not be repeated herein. As shown in FIG. 10, on the basis of the laser device 10 shown in FIG. 1, the laser device 10 further includes a cover plate 105, a light-transmissive layer 106 and a collimating lens group 107.

An inner edge of the cover plate 105 is recessed in the direction proximate to the bottom plate 1011, and is fixed to the light-transmissive layer 106. An outer edge of the cover plate 105 is fixed to a side where the opening of the frame body 1012 is located. The bottom plate 1011, the frame body 1012, the cover plate 105 and the light-transmissive layer 106 form an closed accommodating space, and the heat sink 102, the light-emitting chip 103 and the reflecting prism 104 are all located in the closed accommodating space, so as to prevent water and oxygen from corroding the light-emitting chip 103, and improve the reliability of the light-emitting chip 103. In addition, with this arrangement, it may be possible to reduce a risk that the light-transmissive layer 106 is broken due to the heat generated during the operation of the light-emitting chip 103, thus improve the sealing effect of the closed accommodating space, thereby prolonging the service life of the light-emitting chip 103.

In some embodiments, the closed accommodating space is filled with an inert gas, such as nitrogen, so as to further protect the light-emitting chip 103 and prevent the light-emitting chip 103 from being corroded by water and oxygen.

In some embodiments, a material of the case 101 is oxygen-free copper, a material of the cover plate 105 is stainless steel, and a material of the light-transmissive layer 106 is glass. Since a thermal expansion coefficient of stainless steel is greater than a thermal expansion coefficient of glass, and is less than a thermal expansion coefficient of oxygen-free copper, differences in thermal expansion coefficients of various connected components are small, so as to reduce the stress conducted to the cover plate 105 and the light-transmissive layer 106 when the case 101 is thermally expanded, and improve the production yield of the laser device.

It will be noted that, the light-emitting chip 103 in FIG. 10 may be any one of the light-emitting chips 103 shown in FIGS. 2 to 8, and the heat sink 102 may be any one of the heat sinks 102 shown in FIGS. 2 to 8.

In some embodiments, as shown in FIG. 10, the collimating lens group 107 includes a plurality of collimating lenses. The plurality of collimating lenses correspond to the plurality of light-emitting chips 103, the laser beam emitted by one light-emitting chip 103 irradiates on a corresponding reflecting prism 104, the reflecting prism 104 reflects the incident laser beam toward the corresponding collimating lens, and the laser beam is further collimated by the collimating lens and then is emitted. Collimating a beam refers to converging a divergent beam, so that a divergence angle of the beam becomes smaller and the beam is more approximate to a parallel beam.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A laser device, comprising:
   a bottom plate;
   a frame body being disposed on the bottom plate, the frame body and the bottom plate forming an accommodating space;
   a heat sink being located on the bottom plate and in the accommodating space; and
   a light-emitting chip being located on a surface of the heat sink away from the bottom plate and being located in the accommodating space;
   wherein the light-emitting chip includes a plurality of first protrusions and/or a plurality of first depressions, the plurality of first protrusions and/or the plurality of first depressions are located on a first surface of the light-emitting chip, the first surface is fixed to the heat sink; the heat sink includes a plurality of second depressions and/or a plurality of second protrusions, the plurality of second depressions and/or the plurality of second protrusions are located on the surface of the heat sink, the surface of the heat sink is fixed to the light-emitting chip; the first surface of the light-emitting chip is in contact with the surface of the heat sink, the plurality of first protrusions are located in the plurality of second depressions, and the plurality of second protrusions are located in the plurality of first depressions;

wherein the light-emitting chip includes a first electrode, a light-emitting layer and a second electrode that are sequentially stacked in a direction away from the bottom plate;

the light-emitting layer includes a plurality of protrusions and/or a plurality of depressions, and the plurality of protrusions and/or the plurality of depressions are located on a surface of the light-emitting layer proximate to the bottom plate; and the first electrode includes the plurality of first protrusions and/or the plurality of first depressions, the plurality of first protrusions correspond to the plurality of protrusions in the light-emitting layer, and the plurality of first depressions correspond to the plurality of depressions in the light-emitting layer;

wherein the light-emitting layer includes an insulating layer, a second semiconductor layer, an active layer, a first semiconductor layer and a substrate that are sequentially stacked in the direction away from the bottom plate;

the second semiconductor layer includes the plurality of protrusions and/or the plurality of depressions, and the plurality of protrusions and/or the plurality of depressions are located on a surface of the second semiconductor layer proximate to the bottom plate; and the first electrode is located on a surface of the insulating layer proximate to the bottom plate, and the first electrode in contact with the second semiconductor layer;

wherein the second semiconductor layer further includes a protruding portion, and the protruding portion is located on a side of the second semiconductor layer proximate to the bottom plate;

a surface of the second semiconductor layer proximate to the bottom plate includes a first region and a second region, a surface of the protruding portion proximate to the bottom plate defines the second region, a remaining portion of the surface of the second semiconductor layer proximate to the bottom plate other than the second region includes the first region;

the plurality of protrusions and the plurality of depressions are provided on the surface of the protruding portion proximate to the bottom plate; and the insulating layer covers the first region but not the second region, and a laser beam emitted by the light-emitting chip exits from the protruding portion.

2. The laser device according to claim 1, wherein the plurality of protrusions in the light-emitting layer are protrusions manufactured by means of additive manufacturing, and/or, the plurality of depressions in the light-emitting layer are depressions manufactured by means of subtractive manufacturing.

3. The laser device according to claim 1, wherein a height of at least one protrusion of the plurality of protrusions in the light-emitting layer is in a range from 0.5 µm to 10 µm, and/or, a depth of at least one depression of the plurality of depressions in the light-emitting layer is in a range from 0.5 µm to 10 µm.

4. The laser device according to claim 3, wherein a thickness of the first electrode is in a range from 50 nm to 300 nm.

5. The laser device according to claim 3, wherein a thickness of the first electrode is same at each position.

6. The laser device according to claim 1, wherein the plurality of protrusions and/or the plurality of depressions are arranged in a partial region of the surface of the light-emitting layer proximate to the bottom plate.

7. The laser device according to claim 1, wherein a thickness of the insulating layer is less than a height of the protruding portion; or, the thickness of the insulating layer is equal to the height of the protruding portion;

the height of the protruding portion is a distance between the first region and the second region in a direction perpendicular to the bottom plate.

8. The laser device according to claim 1, wherein the light-emitting chip emits a red laser beam, and the light-emitting layer includes a plurality of protruding portions; or, the light-emitting chip emits a blue laser beam, and the light-emitting layer includes one protruding portion; or, the light-emitting chip emits a green laser beam, and the light-emitting layer includes one protruding portion.

9. The laser device according to claim 1, wherein the heat sink includes a solder layer, and the solder layer is configured to solder the light-emitting chip;

the light-emitting layer includes a plurality of protrusions and/or a plurality of depressions, and the plurality of protrusions and/or the plurality of depressions are located on a surface of the light-emitting layer proximate to the bottom plate;

the solder layer includes the plurality of second depressions and/or the plurality of second protrusions, the plurality of second depressions correspond to the plurality of protrusions in the light-emitting layer, and the plurality of second protrusions correspond to the plurality of depressions in the light-emitting layer.

10. The laser device according to claim 9, further comprising conductive pins; wherein, the heat sink further includes a heat dissipation substrate and a conductive layer that are sequentially stacked in a direction away from the bottom plate, and the solder layer is located on a side of the conductive layer away from the bottom plate;

the conductive layer is configured to be electrically connected to the conductive pins, and is electrically connected to the light-emitting chip through the solder layer;

the heat dissipation substrate is configured to conduct heat generated by the light-emitting chip to the bottom plate.

11. The laser device according to claim 1, further comprising a reflecting prism; the reflecting prism is located on a light-exit side of the light-emitting chip, and an end of the light-emitting chip proximate to the reflecting prism protrudes relative to an end of the heat sink proximate to the reflecting prism.

12. The laser device according to claim 1, further comprising:

a light-transmissive layer covering at an opening of the accommodating space, the opening being on a side of the frame body away from the bottom plate; and

a cover plate, an inner edge of the cover plate being fixed to the light-transmissive layer, and an outer edge of the cover plate being fixed to the frame body;

wherein the accommodating space is filled with an inert gas.

13. A laser projection apparatus, comprising:

a laser source including the laser device according to claim 1, the laser source being configured to emit illumination beams;

an optical engine being configured to modulate the illumination beams emitted by the laser source to obtain projection beams; and a projection lens being configured to project the projection beams into an image.

14. A laser device, comprising:

a bottom plate;

a frame body being disposed on the bottom plate, the frame body and the bottom plate forming an accommodating space;

a heat sink being located on the bottom plate and in the accommodating space; and a light-emitting chip being located on a surface of the heat sink away from the bottom plate and being located in the accommodating space;

wherein the light-emitting chip includes a plurality of first protrusions and/or a plurality of first depressions, the plurality of first protrusions and/or the plurality of first depressions are located on a first surface of the light-emitting chip, the first surface is fixed to the heat sink; the heat sink includes a plurality of second depressions and/or a plurality of second protrusions, the plurality of second depressions and/or the plurality of second protrusions are located on the surface of the heat sink, the surface of the heat sink is fixed to the light-emitting chip; the first surface of the light-emitting chip is in contact with the surface of the heat sink, the plurality of first protrusions are located in the plurality of second depressions, and the plurality of second protrusions are located in the plurality of first depressions;

wherein the light-emitting chip includes a first electrode, a light-emitting layer and a second electrode that are sequentially stacked in a direction away from the bottom plate;

the light-emitting layer includes a plurality of protrusions and/or a plurality of depressions, and the plurality of protrusions and/or the plurality of depressions are located on a surface of the light-emitting layer proximate to the bottom plate; and the first electrode includes the plurality of first protrusions and/or the plurality of first depressions, the plurality of first protrusions correspond to the plurality of protrusions in the light-emitting layer, and the plurality of first depressions correspond to the plurality of depressions in the light-emitting layer;

wherein the light-emitting layer includes a substrate, a first semiconductor layer, an active layer, a second semiconductor layer and an insulating layer that are sequentially stacked in the direction away from the bottom plate;

the substrate includes the plurality of protrusions and/or the plurality of depressions, and the plurality of protrusions and/or the plurality of depressions are located on a surface of the substrate proximate to the bottom plate; and the first electrode is located on the surface of the substrate proximate to the bottom plate;

wherein the second semiconductor layer further includes a protruding portion, and the protruding portion protrudes toward a side away from the bottom plate;

a surface of the second semiconductor layer away from the bottom plate includes a first region and a second region, a surface of the protruding portion away from the bottom plate defines the second region, a remaining portion of surface of the second semiconductor layer away from the bottom plate other than the second region includes the first region; and the insulating layer covers the first region but not the second region, and a laser beam emitted by the light-emitting chip exits from the protruding portion.

15. The laser device according to claim 14, wherein a thickness of the insulating layer is less than a height of the protruding portion; or the thickness of the insulating layer is equal to the height of the protruding portion;

the height of the protruding portion is a distance between the first region and the second region in a direction perpendicular to the bottom plate.

16. The laser device according to claim 14, wherein the light-emitting chip emits a red laser beam, and the light-emitting layer includes a plurality of protruding portions; or, the light-emitting chip emits a blue laser beam, and the light-emitting layer includes one protruding portion; or, the light-emitting chip emits a green laser beam, and the light-emitting layer includes one protruding portion.

17. The laser device according to claim 14, wherein the plurality of protrusions in the light-emitting layer are protrusions manufactured by means of additive manufacturing, and/or, the plurality of depressions in the light-emitting layer are depressions manufactured by means of subtractive manufacturing.

18. The laser device according to claim 14, wherein a height of at least one protrusion of the plurality of protrusions in the light-emitting layer is in a range from 0.5 μm to 10 μm, and/or, a depth of at least one depression of the plurality of depressions in the light-emitting layer is in a range from 0.5 μm to 10 μm.

19. The laser device according to claim 18, wherein a thickness of the first electrode is in a range from 50 nm to 300 nm, and/or, a thickness of the first electrode is same at each position.

20. A laser projection apparatus, comprising:

a laser source including the laser device according to claim 14, the laser source being configured to emit illumination beams;

an optical engine being configured to modulate the illumination beams emitted by the laser source to obtain projection beams; and a projection lens being configured to project the projection beams into an image.

* * * * *